United States Patent [19]

Bagdasarian et al.

[11] 4,393,321

[45] Jul. 12, 1983

[54] SURFACE ACOUSTIC WAVE TRANSDUCER

[76] Inventors: Alexandr S. Bagdasarian, ulitsa Popova, 10, kv. 12, Moskoyskaya oblast, Fryazino; Jury V. Gulyaev, ulitsa Baikalskaya, 23, kv. 29; Vladimir N. Fedorets, Ryazansky prospekt, 95, korpus 4, kv. 66, both of Moscow; Anatoly M. Kmita, prospekt Mira, 22, kv. 231, Moskovskaya oblast, Fryazino, all of U.S.S.R.

[21] Appl. No.: 269,019

[22] PCT Filed: Aug. 27, 1980

[86] PCT No.: PCT/SU80/00147
§ 371 Date: May 28, 1981
§ 102(e) Date: May 22, 1981

[87] PCT Pub. No.: WO81/00939
PCT Pub. Date: Apr. 2, 1981

[30] Foreign Application Priority Data

Sep. 28, 1979 [SU] U.S.S.R. .............................. 2821084

[51] Int. Cl.³ ........................................... H01L 41/10
[52] U.S. Cl. ................................ 310/313 B; 333/150; 333/193
[58] Field of Search ........... 310/313 R, 313 B, 313 C, 310/313 D; 333/150, 151, 193–196

[56] References Cited

U.S. PATENT DOCUMENTS

| 4,066,985 | 1/1978 | Kuny .............................. 310/313 C |
| 4,162,415 | 7/1979 | Andreev et al. ................ 310/313 B |
| 4,166,257 | 8/1979 | Subramanian .................. 333/196 X |
| 4,185,218 | 1/1980 | Bagdasarian et al. .......... 310/313 B |

OTHER PUBLICATIONS

Gulaev, "Saw Transducer With Capacitive Electrode Weighting", Sov. Tech. Phys. Lett. 5(6), Jun. 1979, pp. 287–288.

Primary Examiner—William M. Shoop
Assistant Examiner—Peter S. Wong
Attorney, Agent, or Firm—Lilling & Greenspan

[57] ABSTRACT

An interdigital surface acoustic wave transducer comprises a substrate having at least two areas. One area has piezoelectric properties. Laid down on it is a main row with electrodes. The other area has no piezoelectric properties and carries an additional row with electrodes. Each row comprises two groups of electrodes arranged in parallel with one another. The electrodes of first groups of the rows are connected electrically to respective current-conducting pads. The electrodes of second groups of the rows are connected conductively to one another and are positioned between the electrodes of the first groups of the rows. As a result, overlap portions of the electrodes of the two groups are formed which have a constant length in the main row and a variable length in the additional row.

5 Claims, 3 Drawing Figures

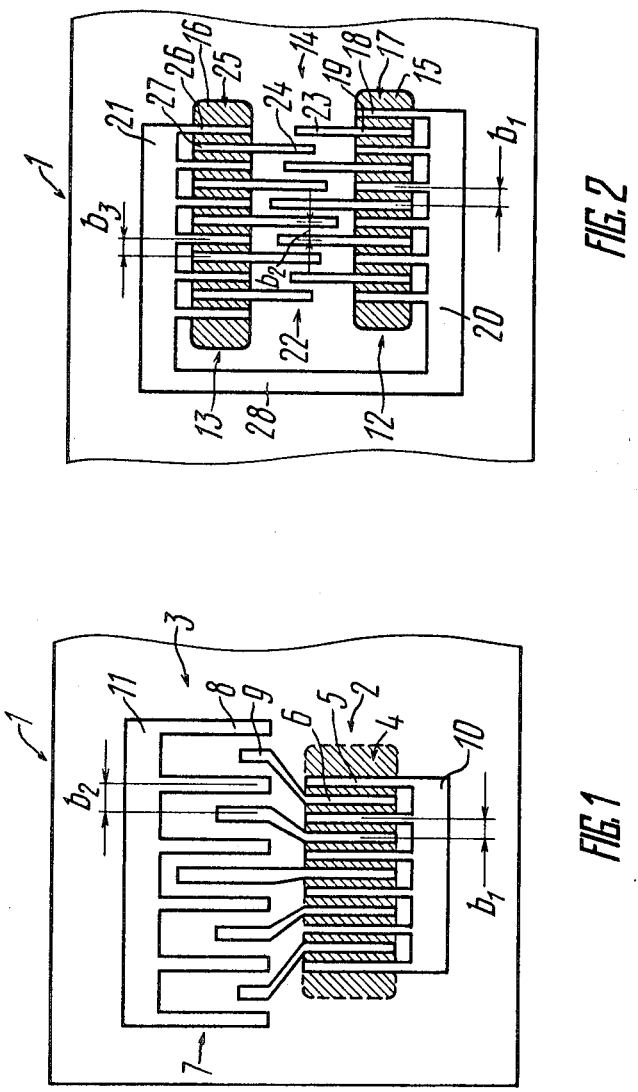

SURFACE ACOUSTIC WAVE TRANSDUCER

FIELD OF INVENTION

The invention relates to surface acoustic wave (SAW) transducers, and more particularly to capacitive-weighting transducers.

DESCRIPTION OF THE PRIOR ART

Known in the art is an interdigital capacitive-weighting SAW transducer comprising a piezoelectric substrate and an array of electrodes laid down on said substrate, said array of electrodes including a first group of electrodes arranged in parallel with one another and connected, by means of a capacitive coupling, to a first current-conducting pad, and a second group of electrodes connected to a second current-conducting pad by means of a capacitive coupling and arranged in parallel with said electrodes of said first group, the electrodes of the first group being positioned in the corresponding spaces between the adjacent electrodes of the second group so that overlap regions of the electrodes of the both groups are formed, said overlap regions having a constant length.

The capacitive coupling between the electrodes and their respective current-conducting pads is provided by depressions made in the latter and the electrode ends that enter said depressions. The capacitance between each electrode and the respective current-conducting pad depends on the depression perimeter and the width of the gap which is available between the end of the electrode in the depression and that pad. The fashion in which the capacitances vary with the transducer length depends on a given impulse response of the transducer and is selected by varying the depression depth and the width of the gap between the ends of the corresponding electrodes and their current-conducting pad (cf. U.S. Pat. No. 3,904,996, Sept. 9, 1975).

In the known transducer, there results a considerable energy loss in the working frequency band. This is due to the fact that in the frequency passband surface acoustic waves are excited not only within the overlap regions of the electrodes of the both groups, but also in the gaps between the current-conducting areas and the ends of the electrodes that enter these areas. In addition, diffraction effects occur in the transducer since surface acoustic waves with circular front are excited at the areas having shallow depressions. It is known that diffraction results in a distortion of the impulse response and, consequently, to a distortion of the frequency response in the passband of the transducer, which in turn causes poor suppression of the signals beyond this passband.

There is a capacitive-coupling SAW transducer offering smaller energy loss in the working frequency range (cf. U.S. Pat. No. 4,162,415, July 24, 1975).

This transducer comprises a substrate of a piezoelectric material in which surface acoustic waves may be propagated and at least two rows of electrodes laid down on said substrate, a first main row including a first group of electrodes arranged in parallel with one another and connected electrically to a first current-conducting pad, and a second group of electrodes arranged in parallel with said electrodes of said first group. The electrodes of said first group are positioned in the corresponding spaces between the adjacent electrodes of the second group so that overlap regions of the electrodes of the both groups are formed, said overlap regions having a constant length. The electrodes of said second group are connected to a second current-conducting pad. A second (additional) row of said two rows is positioned between said main row and said second current-conducting area and includes a first group of electrodes arranged in parallel with one another and electrically connected to said second current-conducting pad, and also includes a second group of electrodes arranged in parallel with said electrodes of said first group in said additional row. In said two groups of said additional row certain number of their electrodes are positioned in the spaces therebetween in a manner such that overlap regions of the electrods are formed which have a variable length depending on a given impulse response of the transducer, said electrodes of said second group in said additional row being coupled conductively and directly to the corresponding electrodes of the second group of the main row, thereby providing a capacitive coupling between the last mentioned electrodes and its corresponding current-conducting pad.

In the described transducer, the distance between the longitudinal axes of the adjacent electrodes belonging to said two groups of the main row depends on a condition in which acoustic synchronism is provided at the central frequency or at the frequancy of a respective harmonic of the excited (received) surface acoustic wave. On the other hand, the distance between the longitudinal axes of the adjacent electrodes belonging to said two groups of said additional row is selected to be one differing from the distance above. This provides for a condition in which the frequency band for the surface acoustic waves excited by the electrodes of said additional row lies outside the limits of the frequency band of the surface acoustic waves which are excited by the electrodes of the main row. With the two distances so selected, the transducer has a considerably smaller energy loss in its passband than the transducer mentioned above.

The transducer as disclosed in U.S. Pat. No. 4,162,415 is disadvantageous in that diffraction effects occur therein. This is due to the fact that those pairs of the electrodes of the additional row which have a small area of their overlap regions produce surface acoustic waves with circular front. Such waves are propagated both in parallel with the direction of propagation of the surface acoustic waves excixted by the electrodes of the main row and at certain angles to that direction. These "inclined" waves are excited in a wide frequency band which includes the passband of the transducer since for them the condition of acoustic synchronism does not depend on all electrodes of the additional row, but depends only on some of them, certain directions of propagation being connected merely with one pair of the electrodes.

There may be a situation in which the transducer above operates in conjunction with an output surface acoustic wave transducer, which is situated in the acoustic channel incorporating the electrodes of the main row. Under these circumstances, said surface acoustic waves excited by the electrodes of the additional row and propagated at an angle to the direction of propagation of the surface acoustic waves which are excited by the electrodes of the main row, are transferred to the output transducer and introduce a distortion in its frequency response and also in the frequency response of the whole system. In particular, the frequency response tends to broaden at the 35–40 dB level and the rejection points are shifted with respect to the frequency spectrum.

The described events are especially characteristic of the operation of the described transducer in conjunction with an apodization-type transducer.

A way out is to deposit an absorber on the electrodes of the additional row. This, however, cannot provide a considerable decrease in the level of the inclined surface acoustic waves since in this case the absorber is within their path equal to the wavelength approximately and absorption does not exceed 10 dB.

SUMMARY OF THE INVENTION

The invention has essentially for its aim the creation of an interdigital capacitive-weighting SAW transducer having a substrate and two rows of electrodes, main and additional, laid down on it, the properties of the substrate and the arrangement of the rows of the electrodes being such that diffraction effects impairing the frequency response of the transducer are eliminated and small energy loss in the transducer passband occurs.

There is provided an interdigital capacitive-coupling SAW transducer comprising a substrate of a material in which surface acoustic waves may be propagated and at least two rows of electrodes laid down on said substrate, a main row of said two rows comprising a first group of electrodes arranged in parallel with one another and connected electrically to a first current-conducting pad, and a second group of electrodes arranged in parallel with said electrodes of said first group. The electrodes of said first group are positioned in the corresponding spaces between the adjacent electrodes of the second group so that overlap regions of the electrodes of the both groups are formed, said overlap regions having a constant length. Electrodes of said second group are connected to a second current-conducting pad. A second (additional) row of said two rows positioned between said main row and said second current-conducting pad includes a first group of electrodes arranged in parallel with one another and electrically connected to said second current-conducting pad, and also comprising a second group of electrodes arranged in parallel with said electrodes of said first group in said additional row and arranged between the last mentioned electrodes in a manner such that at least some of the electrodes of said two groups of the additional row form overlap regions of a variable length, said length being determined by a given impulse response of the transducer. The electrodes of said second group of said additional row are coupled conductively and in a direct way to the corresponding electrodes of the second group of the main row, said substrate comprises, according to the invention, at least two areas, one of which having and the other having no piezoelectric properties, the main row being arranged on said first area having piezoelectric properties, and the additional row being arranged on said second area having no piezoelectric properties.

Preferably, said first area of said substrate which has piezoelectric properties should be made of a polarized ceramic material and said second area of said substrate which has no piezoelectric properties should be made of a nonpolarized ceramic material.

Advantageously, said substrate should be made of a non-piezoelectric material and have some portion thereof covered with a film of a piezoelectric material, which results in a condition in which said portion of said substrate located under said film is held in acoustic contact with the latter and is thus given piezoelectric properties.

Preferably, said film should be deposited directly on the substrate surface and the electrodes of the main row should be arranged on the film.

Advantageously, the film should be arranged on top of the electrodes of the main row.

The embodiments of the disclosed transducer make possible the elimination of the diffraction effects that could introduce a distortion in the frequency response of the transducer; under these circumstances, there is no increase in the energy loss in the frequency passband of the transducer due to the fact that the electrodes of the additional row do not excite surface acoustic waves in the substrate, but merely perform a function of a frequency-independent capacitive voltage divider whose output is connected to the electrodes of the main row.

BRIEF DESCRIPTION OF THE DRAWINGS

The invention will now be described in more detail, by way of example, with reference to the accompanying drawings, in which:

FIG. 1 is a plan view of a surface acoustic wave transducer in which a substrate comprises two areas, according to the invention;

FIG. 2 is a plan view of another embodiment of an acoustic wave transducer in which a substrate comprises three areas, according to the invention.

DETAILED DESCRIPTION OF THE INVENTION

Figure 3:
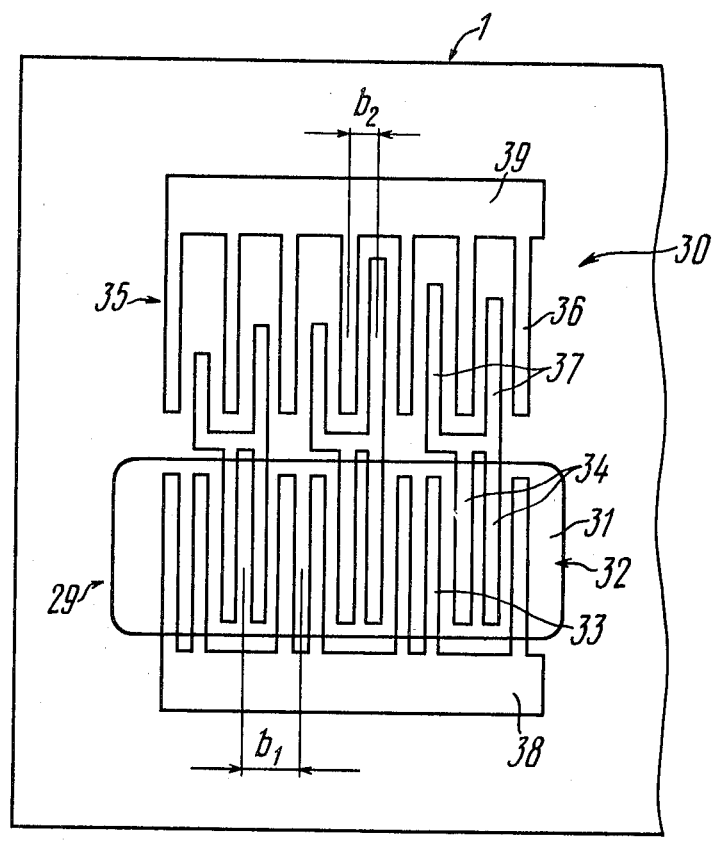
FIG. 3 is a plan view of a surface acoustic wave transducer in which a substrate comprises three areas, according to the invention.

Referring to FIG. 1, the interdigital surface acoustic wave transducer of the invention comprises a substrate 1 made of a material in which surface acoustic waves can be propagated. In this embodiment, the substrate 1 comprises two areas 2 and 3. The area 2 possesses piezoelectric properties, while the area 3 does not. To gain better understanding of the essence of the invention, the area 2 has a dashed line contour and is hatched.

The substrate 1 made, for example, from a piezoceramic material based on a lead-zirconate titanate has a polarized area 2 and a nonpolarized area 3.

The area 2 made of a polarized ceramic material carries a main row 4 including electrodes 5 and 6. A first group of the row 4 comprises the electrodes 5 arranged in parallel with one another, while a second group of that row comprises the electrodes 6 which are arranged in parallel with the electrodes 5 and are positioned between respective electrodes 5 so that the electrodes 5 and 6 of the both groups form overlap regions of a constant length. The area 3 made of a nonpolarized ceramic material carries an additional row 7 that includes electrodes 8 and 9. A first group of the additional row 7 comprises the electrodes 8 arranged in parallel with one another, while a second group of that rows comprises the electrodes 9 arranged in parallel with the electrodes 8 and are positioned between the respective ones of the electrodes 8 so that the electrodes 8 and 9 of the both groups of the additional row from overlap regions of a variable length which is determined by a given impulse response of the transducer.

The area 3 of the substrate 1 is provided with a current-conducting pad 10 coupled conductively (connected electrically) to the electrodes 5 of the main row 4, and with a current-conducting pad 11 coupled conductively (connected electrically) to the electrodes 8 of the additional row 7. The electrodes 9 are connected conductively in a direct way to the corresponding electrodes 6. It is seen that the additional row 7 is positioned between the main row 4 and the current-conducting pad 11 and each electrode 6 of the main row 4 is connected to the pad 11 via a capacitance (capacitive coupling) which is formed by the respective electrode 9, adjacent electrodes 8 and that portion of the pad 11 which adjoins the electrodes 8.

In the additional row 7, all electrodes 8 and 9 of the both groups form overlap regions of a variable length. There may be another embodiment of the transducer in which only some of the electrodes of the two groups have overlap regions of a variable length.

The distance $b_1$ between the longitudinal axes of the adjacent electrodes 5 and 6 depends on the central working frequency of the transducer. The distance $b_2$ between the longitudinal axes of the adjacent electrodes 8 and 9 of the additional row 7 is selected on an arbitrary basis. It depends on the characteristics of the fabrication process of the transducer and must be such that a comparatively small difference exists between the lengths of the main row 4 and the additional row 7. In the described embodiment $b_2 > b_1$, a relationship suitable for the transducers operating at high frequencies, since the resolution provided by a photolithographic process may be somewhat decreased in this case.

The embodiment above deals with a substrate that comprises two areas; one of them, possessing piezoelectric properties, carries the main row of the electrodes, while the other, having no piezoelectric properties, carries the additional row of the electrodes. However, the substrate may comprise three and more areas provided the following condition is satisfied: the main rows of the electrodes are laid down on the areas having piezoelectric properties and the additional rows of the electrodes are laid down on the areas having no piezoelectric properties.

Referring to FIG. 2, a substrate 1 comprises three areas 12, 13 and 14. The areas 12 and 13 possess piezoelectric properties, while the area 14 does not. The substrate 1 is made from a nonpiezoelectric material, which is glass in the described embodiment. Other materials such as sapphire, fused quartz, garnets and spinels can be used for the fabrication of the substrate 1.

Some portion of the substrate 1 is covered with films 15 and 16 of a piezoelectric material, these films being held in acoustic contact with the areas 12 and 13. As a result, the areas 12 and 13 under the films 15 and 16 have piezoelectric properties. In the described embodiment, the films 15 and 16 are deposited directly on to the surface of the substrate 1. To gain a better understanding of the essence of the invention, FIG. 2 shows the films 15 and 16 hatched. These films are made of zinc oxide. Other materials such as cadmium sulfide, lithium niobate and aluminium nitride can be used for the fabrication of the films.

Laid down on the area 12 covered with the film 15 is a first main row 17 including electrodes 18 and 19, said main row 17 being implemented in a similar manner to the main row 4 of FIG. 1. On the area 14 having no piezoelectric properties are current-conducting pads 20 and 21 and an additional row 22 including electrodes 23 and 24. A first group of the row comprises the electrodes 23 arranged in parallel with one another, while a second group of the row comprises the electrodes 24 which are arranged in parallel with the electrodes 23 and are positioned between this latter in a manner such that the electrodes of the two groups form overlap regions of a variable length. Laid down on the area 13 covered with the film 16 is a second main row 25 including electrodes 26 and 27. A first group of the row 25 comprises the electrodes 26 arranged in parallel with one another, while a second group of the row 25 comprises the electrodes 27 which are arranged in parallel with the electrodes 26 and are positioned between the latter in a manner such that the electrodes of the two groups form overlap regions of a constant length.

The electrodes 23 of the first group of the additional row 22 are connected conductively and in a direct way to the electrodes 19 of the first main row 17. The electrodes 24 of the second group of the additional row 22 are connected conductively and in a direct way to the electrodes 27 of the second group of the second main row 25, while the electrodes 26 of the first group of the second main row 25 are connected to the current-conducting pad 21. As a result, the electrodes 23 and 24 of the additional row 22 provide for a capacitive coupling between the electrodes 19 of the first main row 17 and the current-conducting pad 21 and between the electrodes 27 of the second main row 25 and the current-conducting pad 20.

The transducer according to the described embodiment can be used to convert the surface acoustic waves, propagated in the acoustic channel comprising the first main row 17 with the electrodes 18 and 19, to the surface acoustic waves which are propagated in the acoustic channel comprising the second main row 25 with the electrodes 26 and 27. Here, the current-conducting pads 20 and 21 connect each other by means of a current-conducting jumper 28. The distance $b_1$ between the longitudinal axes of the adjacent electrodes 18 and 19 of the first main row 17 is equal to the distance $b_3$ between the longitudinal axes of the adjacent electrodes 26 and 27 of the second main row 25. The distance $b_2$ between the longitudinal axes of the adjacent electrodes 23 and 24 is selected on an arbitrary basis. In the described embodiment, $b_2 = b_1 = (b_3)$, a most useful relationship that takes into account design and fabrication characteristics.

An analogous transducer can be used as a two-channel transducer, either input or output. In such embodiment, the jumper is removed and the current-conducting pads are connected to an electric signal source or a load. In the case of parallel operation of the two channels, $b_1 = b_3$; when the channels utilize frequency selection mode, $b_1 \neq b_3$.

Referring to FIG. 3, a substrate 1 comprises two areas 29 and 30. The area 29 possesses piezoelectric properties, while the area 30 does not.

The substrate 1 is made of a nonpiezoelectric material, which is glass in the described embodiment. Some portion of the surface of the substrate 1 is covered with a film 31 of a piezoelectric material. The film 31 is held in acoustic contact with the area 29, with the result that the latter acquire piezoelectric properties. The film 31 is made of zinc oxide.

Laid down on the area 29 having piezoelectric properties is a main row 32 including electrodes 33 and 34. An additional row 35 with electrodes 36 and 37 is arranged on the area 30 having no piezoelectric properties. The film 31 is laid on top the electrodes 33 and 34 of the main row 32.

The main row 32 with the electrodes 33 and 34 and the additional row 35 with the electrodes 36 and 37 are basically analogous to the main and additional rows shown in FIG. 1.

The described embodiment is unique, however, in that the electrodes 33 of the first group of the main row 32, which are connected conductively to a current-conducting pad 38, as well as the electrodes 34 of the second group of the main row 32, are split. This allows for the elimination of the effects connected with secondary reflection of surface acoustic waves. Each of the split electrodes 34 is connected conductively with two adjoining electrodes 37 in one of the groups of the additional row 35 and the electrodes 36 of the other group of said row are connected conductively to a current-conducting pad 39. The distance $b_1$ between the longitudinal axes of the adjacent electrodes 33 and 34 is selected to be greater than the distance $b_2$ between the longitudinal axes of the adjacent electrodes 36 and 37; in particular, a relationship $b_1 = 2b_2$ is employed. As a result, the main 32 and additional 35 have the same length.

To calculate the characteristics of any embodiment of the transducer of the invention, one must determine a relationship between the variation of the length of the overlap regions of the electrodes of the groups of the additional row, as measured along the transducer, and the given impulse response thereof (cf. U.S. Pat. No. 4,162,415, July 24, 1979).

The transducer described with reference to FIG. 1 can be manufactured in the following manner. A metallic electrode is deposited on the area 2 of the substrate 1 made of a polished piezoceramic material by using the vacuum deposition method, a mask being employed to define the contrours of the electrode. A solid metallic electrode is deposited on the opposite side of the substrate 1.

With a voltage applied between said electrodes, the substrate 1 us heated to a predetermined temperature. After a given hold time, the substrate is cooled and the above voltage is removed. These steps result in a polarization of the area 2 of the substrate 1.

The voltage, temperature and polarization time depend on the characteristics of the piezoelectric material. After polarization step, the metallic electrodes are etched away and an aluminium film is deposited on the whole surface of the substrate 1 by using the vacuum deposition method. The photolithographic method is then used to form on the aluminum film the electrodes 5 and 6 and 8 and 9 of the main row 4 and the additional row 7, respectively, and the current-conducting pads 10 and 11. There are reference marks on the masks which are used for proper arrangement of the electrodes 5 and 6 of the main row 4 on the polarized area 2 of the substrate 1.

The transducer of FIG. 2 is manufactured in the following manner. A piezoelectric film made of zinc oxide is deposited on a polished glass substrate 1 by using the cathode sputtering method, the area 14 of the substrate 1 being covered with a mask. An aluminum film is then deposited on the whole surface of the subsrate 1 and the electrodes of the first main row 17 and the second main row 25, the electrodes of the additional row 22, the current-conducting pads 20 and 21 and the jumper 28 are formed by using the photolithographic method. Like the example above, the described embodiment uses the alignment method by which the electrodes of the first main row 17 and the second main row 25 are properly arranged on the areas 12 and 13, respectively.

The transducer of FIG. 3 is manufactured in analogous manner. Here, a piezoelectric film is deposited after the manufacture of the electrodes of the main row 32 and the additional row 35, and the current-conducting pads 38 and 39.

The transducer of the invention operates as follows. With a high-frequency signal applied to the current-conducting pads 10 (FIG. 1) and 11, there results an alternating-sign potential difference between the adjacent electrodes 5 and 6 of the first and second groups of the main row 4. The value of the potential difference depends on the value of the capacitance that exists between the corresponding electrodes 6 of the main row 4 and the current-conducting pad 11. That is, the potential difference depends on the length of the overlap regions provided by the electrodes 8 and 9 of the first and second groups of the additional row 7. Thus the surface acoustic waves in a frequency band with the central frequency determined by the distance $b_1$ are excited in the area 2 made of a polarized ceramic material. The amplitude of the surface acoustic waves excited by the pair of the adjacent electrodes 5 and 6 of the main row 4 is proportional to the strength of the electric field, which is established between said electrodes. That is, the amplitude depends on the length of the overlap regions provided by the corresponding adjacent electrodes 8 and 9 of the additional row 7. Since the electrodes 8 and 9 are on the area 3 made of the material having no piezoelectric properties, surface acoustic waves are not excited in that area.

The transducer in FIG. 2 operates as follows. A surface acoustic wave propagated through the area 12 of the substrate 1 bearing the film 15 of a piezoelectric material is converted by each pair of the adjacent electrodes 18 and 19 of the first and second groups of the first main row 17 to a high-frequency signal. Each pair of the adjacent electrodes 18 and 19 may be considered as a high-frequency signal source and each respective pair of the adjacent electrodes 26 and 27 of the second main row 25 serves in this case as a load for that source. This is due to the fact that the electrodes 18 of the first group of the first main row 17 and the electrodes 26 of the first group of the second main row 25 are interconnected conductively via the first and second current-conducting pads 20 and 21 and the jumper 28, while the electrodes 19 of the second group of the first main row 17 are connected to the electrodes 27 of the second group of the second main row 25 via the capacitance formed by the corresponding adjacent overlap electrodes 23 and 24 of the additional row 22. Since the electrodes 26 and 27 of the first and second groups of the second main row 25 are on the piezoelectric film 16, which is situated on the area 13 of the substrate 1, a high-frequency signal applied to these electrodes 26 and 27 is converted again to surface acoustic waves. As in the case of the transducer described above, the amplitude of these waves depends on the length of the overlap portions of the electrodes 23 and 24 of the additional row 22. No surface acoustic waves are excited in the area 14 of the substrate 1 that mounts the electrodes 23 and 24 of the additional row 22, since that area has no piezoelectric properties.

The transducer of FIG. 3 operates in the following manner. With a high-frequency signal applied to the current-conducting pads 38 and 39, surface acoustic waves are excited in the area 29 of the substrate 1, said area carrying the main row 32 with the electrodes 33 and 34. These waves are excited on account of an acoustic contact that exists between the area 29 and the film 31 of a piezoelectric material, said film 31 being deposited on top of the electrodes 33 and 34 of the main row 32. The remaining operating events are analogous to those occurred during the operation of the transducer of FIG. 1.

Thus it is seen that in the transducer of the invention surface acoustic waves are excited merely by the electrodes of the main row, and not by the electrodes of the additional row which perform a function of a frequency-independent capacitive voltage divider whose output is applied to the electrodes of the main row.

The transducer of the invention has the following advantages: diffraction effects are eliminated and therefore its frequency response is not distorted; the frequency response does not broaden. Thus the rejection frequencies can be selected accurately and the degree of suppression of the signal at the rejection point is increased.

In the transducer of the invention, it is possible to select such distances between the longitudinal axes of the adjacent electrodes of the additional row which are optimum as to design and fabrication characteristics of the transducer; there is in this case no increase in the energy loss in the passband of the transducer. In particular, one can select the above distances in a manner such that the lengths of the main and additional rows are the same or differ from each other a little. Thus the size of the transition area between the main and additional rows decreases, which causes a decrease in the stray capacitance that exists between the electrodes of the additional row due to the presence of the jumpers connecting them to the electrodes of the main row. This provides for better shape of the frequency response curve of the transducer.

INDUSTRIAL APPLICABILITY

The transducer of the invention can be operated in various devices utilizing surface acoustic waves, such as filters, delay lines, amplifiers and convolvers.

We claim:

1. An interdigital surface acoustic wave transducer comprising a substrate of a material in which surface acoustic waves may be propagated and at least two rows of electrodes are laid down on the substrate, a main row of said rows comprising a first group of electrodes arranged in parallel with one another and connected electrically to a first current-conducting pad, and a second group of electrodes arranged in parallel with said electrodes of said first group, said electrodes of said first group being positioned in corresponding spaces between adjacent electrodes of the second group so that overlap regions of the electrodes of the groups are formed, said overlap regions having a constant length, said electrodes of said second group being connected to a second current-conducting pad, a second row positioned between said main row and said second current-conducting pad and comprising a first group of electrodes arranged in parallel with one another and electrically connected to said second current-conducting pad, and also comprising a second group of electrodes arranged in parallel with said electrodes of said first group in said second row and arranged between the electrodes of said first group in a manner such that at least some of the electrodes of said first and second groups of the second row form overlap regions of a variable length, said length being determined by a given impulse response of the transducer, said electrodes of said second group of said second row being coupled conductively and in a direct way to the corresponding electrodes of the second group of the main row, wherein the improvement comprises the substrate comprising at least first and second areas, the first area having and the second area having no piezoelectric properties, the main row having electrodes arranged on the first area of the substrate having piezoelectric properties, and the second row having electrodes arranged on the second area of the substrate having no piezoelectric properties.

2. A transducer as claimed in claim 1, wherein the first area of the substrate having piezoelectric properties is made of a polarized ceramic material, and the second area of the substrate having no piezoelectric properties is made of a nonpolarized ceramic material.

3. A transducer as claimed in claim 1, wherein the substrate is made of a nonpiezoelectric material and some portion thereof is covered with a film of a piezoelectric material, an area of the substrate located under the film being in acoustic contact with the film and having piezoelectric properties.

4. A transducer as claimed in claim 3, wherein the film is deposited directly on the surface of the substrate and electrodes of a main row are arranged on the film.

5. A transducer as claimed in claim 3, wherein the film is arranged on top of electrodes of a main row.

* * * * *